United States Patent
Na

[11] Patent Number: 5,825,813
[45] Date of Patent: Oct. 20, 1998

[54] TRANSCEIVER SIGNAL PROCESSOR FOR DIGITAL CORDLESS COMMUNICATION APPARATUS

[75] Inventor: Bo-gyu Na, Yongin-gun, Rep. of Korea

[73] Assignee: Samsung Electronics Co., Ltd., Suwon, Rep. of Korea

[21] Appl. No.: 402,506

[22] Filed: Mar. 13, 1995

[30] Foreign Application Priority Data

Mar. 15, 1994 [KR] Rep. of Korea ......................... 94-5106

[51] Int. Cl.[6] .............................. H04B 1/38; H04L 5/16
[52] U.S. Cl. ............................ 375/219; 375/327; 331/2; 331/18; 455/76; 455/78; 455/260
[58] Field of Search .................................. 375/376, 219, 375/271, 327, 324; 331/2, 25, 18, 1 R, 34; 455/75, 76, 78, 83, 84, 260

[56] References Cited

U.S. PATENT DOCUMENTS

| | | |
|---|---|---|
| 4,862,107 | 8/1989 | Paneth .......................................... 331/2 |
| 5,144,254 | 9/1992 | Wilke ........................................... 331/2 |
| 5,150,078 | 9/1992 | Yang et al. .................................. 331/2 |
| 5,194,828 | 3/1993 | Kato et al. ............................... 375/376 |
| 5,319,680 | 6/1994 | Port et al. ................................. 375/376 |
| 5,422,604 | 6/1995 | Jokura ......................................... 331/2 |

*Primary Examiner*—Don N. Vo
*Attorney, Agent, or Firm*—Rothwell, Figg, Ernst & Kurz

[57] ABSTRACT

A transceiver signal processor for a digital cordless communication apparatus adopts a heterodyning loop in order to improve the transmitting circuit and power efficiency. The transceiver signal processor adopts an orthogonal demodulation method for a first intermediate frequency, thereby allowing a single reference loop. Since the reference loop itself need not be switched, a frequency drift problem is fundamentally removed.

3 Claims, 3 Drawing Sheets

TRANSCEIVER SIGNAL PROCESSOR FOR DIGITAL CORDLESS COMMUNICATION APPARATUS

BACKGROUND OF THE INVENTION

The present invention relates to a transceiver signal processor for a digital cordless communication apparatus, and more particularly, to a transceiver signal processor by which the power efficiency of transmission and reception is improved and the effects of frequency drift and internal interference are removed when switching between transmitter and receiver functions, by adopting an orthogonal demodulator and a local oscillator having a heterodyning phase-locked loop (PLL) which achieves fast switching between transmitter and receiver modes.

Among recently standardized digital cordless communication apparatus, a second generation digital cordless telephone (CT2) was originally introduced in the late 1980 and became available to the public in early 1990. The CT2 telephone adopts the frequency division multiple-access time division duplex (FDMA-TDD) method.

FIG. 1 shows a conventional transceiver signal processor adopting a single-PLL method for synthesizing the heterodyned transmitting frequency for use in such a digital cordless telephone.

In FIG. 1, reference numeral 1 designates an antenna input, reference numeral 2 designates an input bandpass filter (BPF), reference numeral 3 designates a transmitter/receiver switch, reference numeral 4 designates a low-noise receiver amplifier, reference numeral 5 designates a radio frequency bandpass filter, reference numeral 6 designates a first receiver mixer, reference numeral 7 designates a first intermediate frequency (IF) receiver bandpass filter, reference numeral 8 designates a second receiver mixer, reference numeral 9 designates a receiver local oscillator (LO), reference numeral 10 designates a second IF receiver bandpass filter, reference numeral 11 designates an IF amplifier, reference numeral 12 designates a demodulator, reference numeral 13 designates a low-pass filter (LPF), reference numeral 14 designates a data restoring unit. FIG. 1 also illustrates a single PLL frequency synthesizer A, wherein reference numeral 15 designates a reference frequency crystal oscillator, reference numeral 16 designates a transceiver frequency synthesizer, and reference numeral 17 designates a voltage-controlled oscillator (VCO). Also, in FIG. 1, reference numeral 18 designates a reception buffer amplifier, reference numeral 19 designates a transmission buffer amplifier, reference numeral 20 designates a transmitter local oscillator, reference numeral 21 designates an amplifier/multiplier stage, reference numeral 22 designates a transmitter bandpass filter, reference numeral 23 designates a transmitter mixer, reference numeral 24 designates a transmission frequency bandpass filter, and reference numeral 25 designates a transmitter power amplifier.

In the transceiver signal processor shown in FIG. 1, single PLL frequency synthesizer (A) having the reference frequency crystal oscillator 15, transceiver frequency synthesizer 16 and VCO 17 is used as a first local oscillator for both the transmitter and receiver portions.

However, in the transceiver signal processor shown in FIG. 1, the maximum phase compared frequency of the single PLL frequency synthesizer (A) cannot exceed the difference frequency between channels, with the loop bandwidth being much smaller than that (generally one tenth or below), so that the locking (stabilizing) time of the loop is rather long as it is inversely proportional to the loop bandwidth. That is to say, since a locking time much greater than the guard time (the time between FDMA-TDD transmission and reception) is required, undesirable frequency transients, occurring due to a load fluctuation between transmit and receive states, cannot be restored (for their subsequent removal) within the guard time. Therefore, the burden of the buffer amplifiers 19 and 18 becomes greater, which is not suitable for high-frequency circuits and results in a lower efficiency.

Also, since frequency switching is not possible due to the foregoing problems, during transmission, the transmitter mixer 23 mixes the output frequency of transmitter local oscillator 20 with the transmitter intermediate frequency to output the required frequency signal. At this time, due to the lossy conversion of the transmitter mixer 23, the gain of transmitter power amplifier 25 should be large. Therefore, the power consumption becomes large when a multi-stage transmitter power amplifier is used.

Also, since the output of the transmitter mixer 23 includes many harmonics and intermodulation components, the multi-stage bandpass filter 24 has high loss which causes design problems.

Also, the burden of high-frequency circuitry due to the foregoing problems lowers the integration efficiency of semiconductor circuits and makes productivity worse. Further, it is then difficult to reduce chip size and cost.

Meanwhile, FIG. 2 shows another conventional transceiver signal processor for use in a digital cordless telephone, which adopts a double-PLL method for synthesizing the heterodyned transmitter/receiver frequencies. In FIG. 2, like elements are designated by the same reference numerals as in FIG. 1, and thus descriptions thereof will be omitted.

Referring to FIG. 2, reference numeral 26 designates a voltage-varied crystal oscillator, reference numeral 27 designates a first frequency multiplier, reference numeral 28 designates a bandpass filter, reference numeral 29 designates a second frequency multiplier, reference numeral 30 designates a reference frequency crystal oscillator, reference numeral 100 designates a transmitter PLL, reference numeral 110 designates a receiver PLL, and reference numeral 200 designates a heterodyning PLL for high-speed switching between transmitter and receiver frequencies. Here, transmitter PLL 100 includes a transmitter frequency synthesizer 31, a transmitter VCO 32, and a buffering amplifier 33; receiver PLL 110 includes a receiver frequency synthesizer 34, a receiver VCO 35, and a buffering amplifier 36; and heterodyning PLL 200 includes a phase comparator 38, a loop low-pass filter 39, a receiver VCO 40, a buffering amplifier 41, a frequency mixer 42, and a low-pass filter 43. Reference numeral 37 designates a second transmitter/receiver switch.

However, since the above heterodyning phase-locked loop methods adopt a frequency discrimination method in which a frequency is demodulated in demodulator 12, by multiplying the second IF itself (which cannot be 0 Hz) with that phase-shifted by 90°, the offset corresponding to the second IF of the receiver is generated at the required transmitter frequency.

At this time, if the offset is set to 0 Hz, since the signal obtained by multiplying the output signal of voltage-varied crystal oscillator 26 in first frequency multiplier 27 coincides with the first IF of the receiver, which is a weak frequency component, the reception sensitivity is destroyed. Thus, it is impossible to set the actual offset to 0 Hz.

Therefore, the transceiver signal processor of FIG. 2 is provided with a separate transmitter PLL 100 and receiver PLL 110. Then, the frequency signals of heterodyning PLL 200 are transmitted or received by transmitter/receiver switch 37. At this time, since the above two frequency signals are alternately selected by transmitter/receiver switch 37, the same problems occur as those generated by transceiver signal processor of FIG. 1.

Also, since two PLL circuits are used, the circuit is complex, and the frequency division rate data of transmit and receive channels should be input separately. Moreover, since two frequencies are generated with a spacing equal to the second IF frequency, the transmitter VCO 32 and receiver VCO 35 are likely to beat with each other.

SUMMARY OF THE INVENTION

Therefore, in order to solve the problem, it is an object to provide a transceiver signal processor which can improve the power efficiency of a transmitter section and remove the effects of frequency drift, by adopting a heterodyning phase-locked loop but adopting an orthogonal modulation method for the first intermediate frequency.

To accomplish the above object, there is provided a transceiver signal processor according to the present invention, for use in a digital cordless communication apparatus having a transmitter for converting and transmitting a signal as a radio wave via an antenna input and a receiver for converting a signal received from the antenna input and processing the converted signal, in a communication system using a time-division method by which a frequency channel is divided by a constant time for transmission and reception, the processor comprising a frequency synthesizer including a first phase-locked loop (PLL) for channel conversion by which the loop frequency of the first PLL is not switched according to a transmit/ receive mode, by setting an offset corresponding to a received second intermediate frequency to 0 Hz, and a second PLL for high-speed switching between transmit and receive frequencies, by setting the output frequency of the first PLL as a reference signal.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 3:
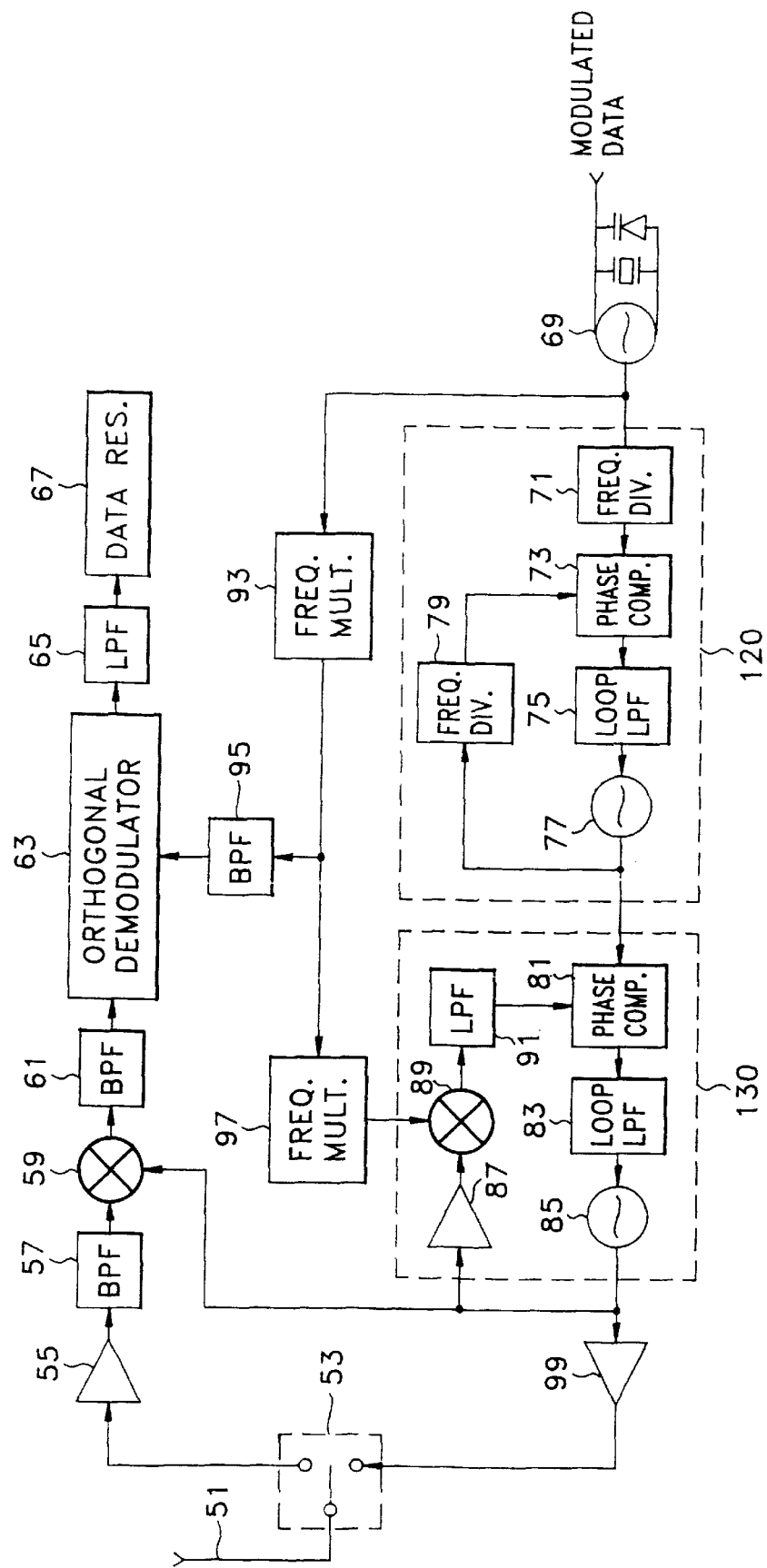
FIG. 3 is a block diagram of a transceiver signal processor according to the present invention, which adopts an orthogonal demodulator and a single-PLL frequency synthesizing local oscillator for use in a digital cordless telephone.

In FIG. 3, reference numeral 51 designates an antenna input, reference numeral 53 designates a transmitter/receiver switch, reference numeral 55 designates a low-noise receiver amplifier, reference numeral 57 designates a carrier bandpass filter, reference numeral 59 designates a receiver mixer, reference numeral 61 designates an IF bandpass filter, reference numeral 63 designates an orthogonal demodulator, reference numeral 65 designates a low-pass filter, reference numeral 67 designates a data restoring unit, reference numeral 69 designates a voltage-varied reference frequency crystal oscillator, reference numeral 71 designates a first frequency divider, reference numeral 73 designates a phase comparator, reference numeral 75 designates a first loop low-pass filter, reference numeral 77 designates a first VCO, reference numeral 79 designates a second frequency divider, reference numeral 81 designates a phase comparator, reference numeral 83 designates a second loop low-pass filter, reference numeral 85 designates a second VCO, reference numeral 87 designates an isolation buffer, reference numeral 89 designates a mixer, reference numeral 91 designates a low-pass filter, reference numeral 93 designates a first frequency multiplier, reference numeral 95 designates a bandpass filter, reference numeral 97 designates a second frequency multiplier, and reference numeral 99 designates a transmitter power amplifier.

Figure 1:
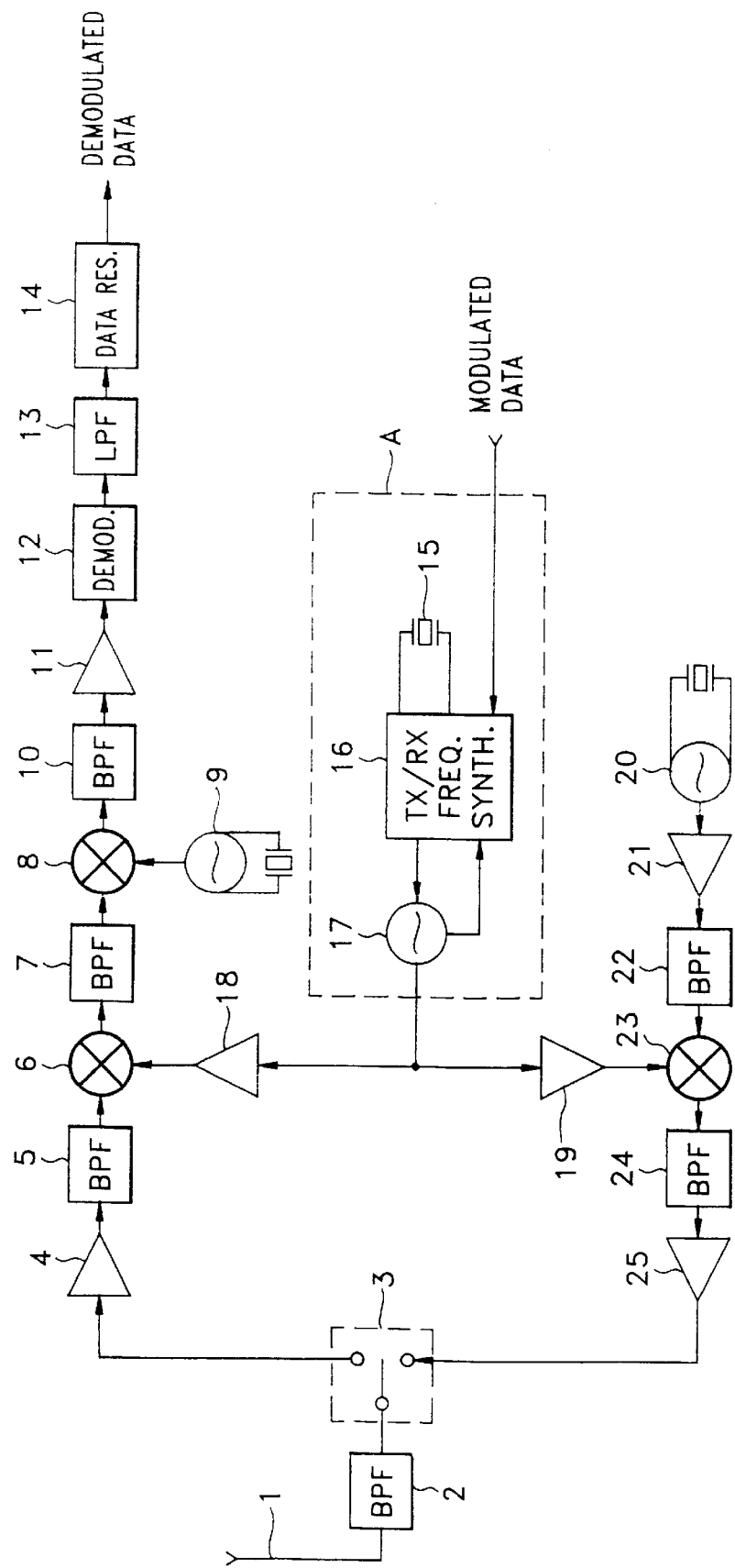
FIG. 1 is a block diagram of a conventional transceiver signal processor adopting a single-PLL method for synthesizing the heterodyned transmitting frequency for use in such a digital cordless telephone.
Figure 2:
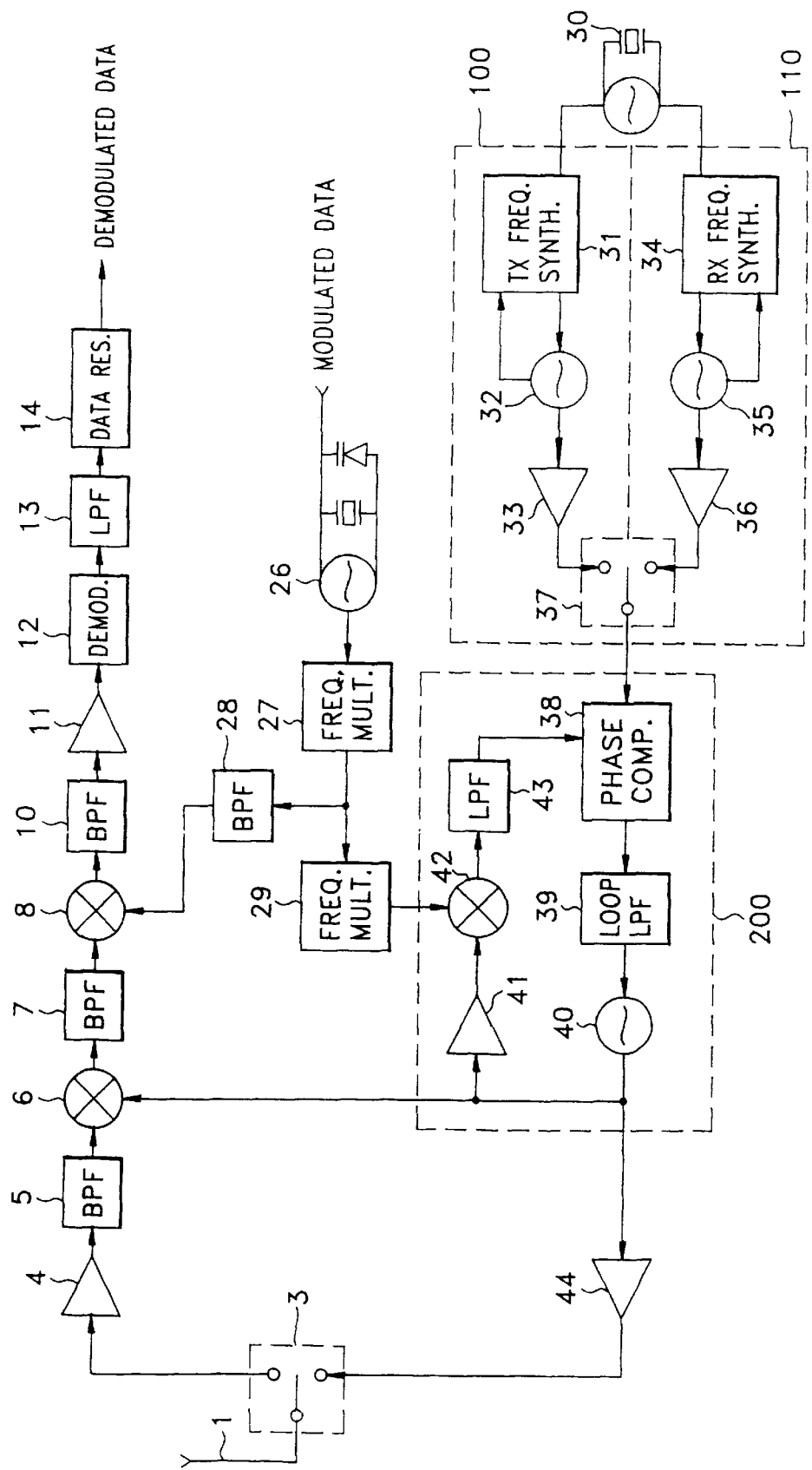
FIG. 2 is a block diagram of another conventional transceiver signal processor adopting a double-PLL method for synthesizing the heterodyned transmitter/receiver frequencies in a digital cordless telephone.

Referring to the circuit of FIG. 3, which comprises many of the same elements as FIGS. 1 and 2, the apparatus largely includes a frequency synthesizer composed of a first PLL 120 constituted by the phase comparator 73, first loop low-pass filter 75, VCO 77 and first and second frequency dividers 71 and 79; a second PLL 130 constituted by the phase comparator 81, second loop low-pass filter 83, VCO 8G, isolation buffer 87, mixer 89 and low-pass filter 91. Here, the first PLL 120 synthesizes the reference frequency for channel conversion such that the frequency of the loop itself does not change, i.e., is the same for both the transmit and receive modes, by setting an offset corresponding to the receiver's second IF to 0 Hz; and the second PLL 130 is for high-speed switching between the necessary frequencies for the transmitter and receiver modes. Also, orthogonal demodulator 63 is further provided for simplifying the reference frequency synthesizing loop (first PLL 120) of second PLL 130.

Next, the operation of the transceiver signal processor according to the present invention shown in FIG. 3 will be described.

Since the conventional FDMA-TDD method by which bi-directional communication (transmission/reception) is divided according to time has the same carrier frequency for both transmission and reception, the receiver section adopts a heterodyning method and the transmitter section transmits the required frequency obtained directly from the output of VCO 85, which is used as a first local oscillator frequency for transmission and reception and is obtained without a mixing process for frequency conversion. For this purpose, in a communication method by which transmission and reception are alternately repeated based on a constant guard time of a determined period, the transmission and reception functions must be switched in a communication period corresponding to the difference of the first received intermediate frequency during transmission and reception. At this time, the frequency synthesizer constituting VCO 85 should be capable of fast switching operation in order to stabilize the frequency within a given guard time.

Accordingly, the present invention provides a heterodyne frequency synthesizer in the form of second PLL 130. Here, since the locking time of the phase-locked loop is inversely proportional to the frequency compared by the phase comparator 81, the required minimum frequency should be set to be minimum. However, according to the FDMA-TDD method, the output frequency of VCO 85 should have a minimum resolution which corresponds to channel spacing (the frequency band between channels). On the contrary, the lower limit frequency which is compared in the phase comparator 81 is restricted.

Therefore, in order to synthesize transmit/receive frequencies having a predetermined spacing, a frequency synthesizer formed by a separate PLL circuit is required; one which does not switch the frequency of the loop itself. This frequency synthesizer is embodied by first PLL 120.

In order to produce a frequency $f_h$ to be compared in phase comparator 81 of second PLL 130, mixer 89 mixes the output of VCO 85 passing through isolation buffer 87 with a signal obtained by multiplying the reference frequency of crystal oscillator 69 in first and second frequency multipliers 93 and 97. Thereafter, among the mixed frequency components, the minimum frequency $f_h$ is extracted in low-pass filter 91 and applied to phase comparator 81. The reference signal for the frequency $f_h$ is applied to first PLL 120 whose output frequency is applied to phase comparator 81 and is compared, thereby finally forming a fast-switchable loop.

At this time, if the produced frequency $f_h$ falls within the desired channel spacing, the output of VCO 85 generates a frequency as the same resolution with that of the single phase-locked loop frequency synthesizer shown in FIG. 1, thereby supplying the generated frequency to receiver mixer 59 and transmitter power amplifier 99. In order to form such a variable frequency $f_h$, the output of VCO 77 is synthesized with a desired resolution, by first PLL 120.

For the sake of explanation, it is assumed that the frequency of the reference frequency crystal oscillator 69 is $f_x$, the multiplication factors of first and second frequency multipliers 93 and 97 are i and j during transmission, the transmit/receive carrier frequency is $f_c$, the first LO frequency input to receiver mixer 59 is $f_{LO1}$, the first IF frequency of the receiver section is $f_{IF1}$, and the second LO frequency input to orthogonal demodulator 63 via bandpass filter 95 is $f_{LO2}$. Thus, according to the operation of second PLL 130, VCO 85 is controlled so as to output frequency $f_c$ in a transmit mode and to output frequency $f_{LO1}$ in a receive mode. Accordingly, in the transmit mode, $f_h=|f_c-(f_xij)|$ and in the receive mode, $f_h=|f_{LO1}-(f_xi(j\pm1)|$. Further, since the output of second frequency multiplier 97 includes both multiplication components j and j±1, there is no need for switching and the frequency of second PLL 130 can remain constant. Here, however, VCO 85 tunes to $f_c$ in a transmit mode and to $f_{LO1}$ in a receive mode.

At this time, the frequency difference between $f_c$ and $f_{LO1}$ is $f_xi$, which also equals $f_{IF1}$. Here, it is impossible to perform frequency discriminating demodulation by heterodyning $f_{IF1}$ again. Therefore, a frequency modulating component is demodulated with a signal of the baseband using orthogonal demodulator 63, satisfying $f_{IF1}=f_{LO1}$. At this time, the second intermediate frequency becomes 0 Hz.

Therefore, second LO frequency $f_{LO2}$ input to orthogonal demodulator 63 via bandpass filter 95 is equal to $f_xi$. Therefore, this signal can be obtained by dividing the output from first frequency multiplier 93.

Since orthogonal demodulator 63 adopts a homodyne (zero-beat) method by which the frequencies of an input signal and LO signal are the same, the multiplied signal of $f_x$ does not act as an interference signal, differently from the heterodyne method shown in FIG. 2, thereby eliminating the fundamental cause of interference between frequencies.

As described above, the transceiver signal processor according to the present invention for use in a digital cordless communication apparatus enables the use of a single reference loop, by using a heterodyning loop for improving the circuitry of the transmission section as well as power efficiency and for preventing the frequency drift phenomenon, and further adopting an orthogonal demodulation method for the first intermediate frequency. Therefore, since there is no need for switching the reference loop itself, the fundamental cause of frequency drift is eliminated.

Also, by adopting the orthogonal demodulation method, the interference due to the harmonics of the reference frequency crystal oscillator (69) which coincide with the IF frequency of the receiver section is substantially removed. Also, owing to the use of a single reference loop, very few beat signals are generated compared with the case of more than one such reference loop being employed.

Also, since the reference loop is simplified, commercial circuits are easily usable. Since the interference between signals is removed, circuit integration with an orthogonal demodulator is allowed. Also, since every possible frequency is generated using a single reference frequency crystal oscillator, costs are low and frequency monitoring is made easy.

Owing to a single loop for synthesizing the channel frequencies, data input operations become simple, which leads to a reduction in the channel conversion time (faster tune time). Thus, for the case of battery-operated devices, power consumption during a reception wait state can be reduced.

What is claimed is:

1. A transceiver signal processor for a digital cordless communication apparatus having a transmitter for converting an electrical signal into a radio wave and transmitting said radio wave via an antenna, and a receiver for converting a radio wave received from said antenna into a received electrical signal and processing the received signal, in a communication system using a time-division method by which a frequency channel is divided into constant time intervals for alternating transmission and reception modes of operation, said processor comprising:

a frequency synthesizer including a first phase-locked loop (PLL) for channel conversion by which the loop frequency of said first PLL is kept constant by setting an offset corresponding to a received second intermediate frequency to 0 Hz, and a second PLL for high-speed switching between transmit and receive frequencies, by setting the output frequency of said first PLL as a reference signal for said second PLL.

2. A transceiver signal processor as claimed in claim 1, further comprising an orthogonal demodulator for receiving an intermediate frequency signal and a frequency derived from said first PLL, and demodulating said intermediate frequency signal to provide a demodulated data signal.

3. A transceiver signal processor as claimed in claim 1, wherein the frequency of a local oscillator within said second PLL is changed without changing the loop frequency of said first PLL.

* * * * *